United States Patent
Hassner et al.

(10) Patent No.: US 6,654,924 B1
(45) Date of Patent: Nov. 25, 2003

(54) SYSTEM AND METHOD FOR ERROR CORRECTION OF DIGITIZED PHASE SIGNALS FROM MR/GMR HEAD READBACK WAVEFORMS

(75) Inventors: Martin Aureliano Hassner, Palo Alto, CA (US); Francesco Rezzi, Santa Clara, CA (US); Barry Marshall Trager, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 448 days.

(21) Appl. No.: 09/675,857

(22) Filed: Sep. 29, 2000

(51) Int. Cl.$^7$ .................. H03M 13/00; G11C 29/00
(52) U.S. Cl. ........................... 714/758; 714/770
(58) Field of Search ................. 714/758, 770, 714/794, 795, 769, 791, 796

(56) References Cited

U.S. PATENT DOCUMENTS

| | | | |
|---|---|---|---|
| 5,257,270 A | * 10/1993 | Hilden et al. ............ 714/781 |
| 5,271,016 A | * 12/1993 | Hilden et al. ............ 714/752 |
| 5,487,077 A | 1/1996 | Hassner et al. .......... 371/40.1 |
| 6,018,304 A | * 1/2000 | Bessios ................... 341/58 |
| 6,052,248 A | * 4/2000 | Reed et al. .............. 360/53 |
| 6,282,690 B1 | * 8/2001 | McClellan et al. ........ 714/801 |
| 6,304,995 B1 | * 10/2001 | Smith et al. ............. 714/786 |
| 6,434,719 B1 | * 8/2002 | Livingston ............... 714/804 |
| 6,526,530 B1 | * 2/2003 | Nazari et al. ............ 714/701 |

OTHER PUBLICATIONS

Stephen B. Wicker, "Error Control Systems for Digital Communication and Storage", Prentice–Hall, 1995.*

S. Benedetto, D. Divsalar, G. Montorsi, and F. Pollara, "A Soft–Input Soft–Output Maximum A Posteriori (MAP) Module to Decode Parallel and Serial Concatenated Codes", TDA Progress Report 42–127, Jet Propulsion Lab, NASA, Nov. 15, 1996.*

Publication: "Fast Quantizing and Decoding Algorithms for Lattice Quantizers and Codes". Conway et al. IEEE, Transactions on Information Theory, vol. IT–28, No. 2, pp. 227–232. Mar. 1982.

Publication: "Codes Over Eisenstein–Jacobi Integers". Huber. American Mathematical Society. Contemporary Mathematics, vol. 168, pp. 165–179. 1994.

* cited by examiner

Primary Examiner—Albert Decady
Assistant Examiner—Joseph D. Torres
(74) Attorney, Agent, or Firm—John L. Rogitz

(57) ABSTRACT

A system and method for algebraically correcting errors in complex digitized phase signals from a magneto-resistive or giant magneto-resistive (MR/GMR) head readback waveform includes a data state machine that encodes phase symbols into data bits in accordance with, e.g., the (1, 10) constraint and a parity state machine that generates parity symbols such that a single inserted parity symbol does not violate the (1, 7) constraint in a run length limited code and furthermore the data following the insertion will not violate the (1, 10) constraint in a run length limited code. The state machines can be used as a trellis to perform maximum likelihood decoding on received coded data, thus performing soft algebraic error detection on received data. The invention thus guarantees better overall error rate performance than hard decision post processing of blocks of detected bits by a parity check matrix which is otherwise vulnerable to loss of bit synchronization at high linear density recording.

11 Claims, 7 Drawing Sheets

ENCODE LOGIC

ENCODE STRUCTURE

| State\Data | A 1 | B 2 | C 3 | D 4 | V 5 |
|---|---|---|---|---|---|
| 4  11 | 101/d | 100/d | 001/d | 010/d | 000/d |
| 3  10 | 101/c | 100/c | 001/c | 010/c | 000/c |
| 2  01 | 100/v | 100/b | 010/v | 010/b | 000/b |
| 1  00 | 101/v | 100/a | 001/v | 010/a | 000/a |

~ 22

FIG. 4 - STATE MACHINE (DATA)

26

| State\Parity | $a^1$ | $b^1$ | $c^1$ | $d^1$ | $v^1$ |
|---|---|---|---|---|---|
| 0 | 0/a | 0/b | 0/c | 0/d | 0/V |
| 1 | 010/a | 010/b | 010/c | 010/d | 010/V |
| 2 | 100/a | 100/b | 001/c | 001/d | 001/V |

FIG. 5 - STATE MACHINE (PARITY)

|     | +0 | 1 | 2 | 3 | 4 | -4 | -3 | -2 | -1 | -0 |
|-----|----|----|----|----|----|----|----|----|----|----|
| +0  | 0  | 0 | 0 | 0 | 0 | 1  | 1  | 1  | 1  | 0  |
| 1   | 0  | 0 | 0 | 0 | 0 | 0  | 0  | 1  | 1  | 1  |
| 2   | 0  | 0 | 0 | 0 | 0 | 1  | 1  | 1  | 1  | 1  |
| 3   | 1  | 1 | 1 | 0 | 0 | 0  | 0  | 0  | 0  | 0  |
| 4   | 0  | 0 | 0 | 0 | 0 | 1  | 1  | 1  | 1  | 1  |
| -4  | 1  | 1 | 1 | 1 | 1 | 0  | 0  | 0  | 0  | 0  |
| -3  | 0  | 0 | 0 | 0 | 0 | 0  | 0  | 1  | 1  | 1  |
| -2  | 1  | 1 | 1 | 1 | 1 | 0  | 0  | 0  | 0  | 0  |
| -1  | 1  | 1 | 1 | 0 | 0 | 0  | 0  | 0  | 0  | 0  |
| -0  | 0  | 1 | 1 | 1 | 1 | 0  | 0  | 0  | 0  | 0  |

(1,7) - CONSTRAINED 3-BIT
MAGNETIC TRANSITION
SYMBOL TRELLIS
CONDUCTIVITY MATRIX

*FIG. 5B*

*(1,7) - CONSTRAINED
3-BIT MAGNETIC
TRANSITION SYMBOL
TRELLIS*

QUANTITATIVE - ALGORITHM

1. $M = \begin{bmatrix} 1 & 0 & -1 \\ \frac{1}{\sqrt{3}} & \frac{-2}{\sqrt{3}} & \frac{1}{\sqrt{3}} \end{bmatrix}$  LATTICE MATRIX $P = [u_1, u_2] = [0.4, -0.4]$ $[u_1, u_2] \cdot M = [X_1, X_2, X_3]$

FIG. 7   HYPERPLANE $X_1 + X_2 + X_3 = 0$ $\underline{X} = [X_1, X_2, X_3] = [0.169, 0.462, -0.631]$

2. NEAREST INTEGER QUANT.

$f(\underline{X}) = [0, 0, -1]$

DEFICIENCY $\Delta = 0 + 0 - 1 = -1$

---

3. $\delta(X_1) = 0.169 < \delta(X_3) = 0.369 < \delta(X_2) = 0.462$

ARRANGE ROUNDING ERRORS IN INCREASING ORDER OF MAGNITUDE

FIG. 8   4. $\Delta < 0 \Rightarrow$ ADD 1
$\qquad\qquad\quad \downarrow$ TO $X_2$ $[X_1, X_2, X_3] = [0, 1, -1]$ RESULTING IN $\Delta = 0$ i.e., HYPERPLANE $X_1 + X_2 + X_3 = 0$

---

FIG. 9   $[0\ 1\ -1] \cdot \frac{1}{2} M^T = [\frac{1}{2}, -\frac{\sqrt{3}}{2}]$ $P \rightarrow -\rho$

SYSTEM AND METHOD FOR ERROR CORRECTION OF DIGITIZED PHASE SIGNALS FROM MR/GMR HEAD READBACK WAVEFORMS

BACKGROUND OF THE INVENTION

1. Field of the Invention

The present invention relates generally to error correction of digitized phase signals from magnetoresistive (MR) and giant magnetoresistive (GMR) storage media heads.

2. Description of the Related Art

In data recording devices such as magnetic disk drives and tape drives, MR and GMR heads are used to read data that has been recorded on the devices. These heads detect magnetic transitions on the storage medium that have been previously established ( "written") on the medium to represent data. The output voltage waveform of the head, mainly its phase, represents the transition locations and, thus, the data on the medium.

As recognized herein, random and systematic errors can be introduced in the output signal of read heads in several ways. For example, errors can be introduced by incorrect read performance of the read head itself. To detect errors, data can be encoded with error correction symbols prior to writing and then decoded during the read process and checked to determine whether any errors occurred, but it is possible that a loss of synchronization between the encoding and decoding operations may render this correction procedure useless. Errors can also be caused by so-called "thermal asperities", wherein the head accidentally contacts the recording medium (or a particle that rests on the medium).

The focus of the present invention is to correct errors in the phases of multi-bit symbols. Block coding regimes have been proposed that include a set of codewords of length "n" defined over a Galois field alphabet and having the property of closure under addition or multiplication of any two codewords. In order to correct t<n errors, the codewords are written onto the recording medium with a separation of at least 2t+1 symbols from each other, with the checks being read along with the data and analyzed to determine whether any errors are present in the read data. As recognized by the present invention, however, block coding structure requires redundancy to guarantee the nonviolation of a code constraint which is vulnerable to loss of bit synchronization.

In addition, parity check schemes are well-known methods for detecting errors by inserting parity check bits into streams of data. As understood by the present invention, existing simple parity check schemes suffer the drawback that they will not detect certain errors. For instance, existing simple parity check methods will not detect single bit shifts unless bit synchronization is maintained, which unfortunately are common errors in magnetic recording at high linear densities and low signal to noise ratios. Moreover, parity check matrices are used to undertake hard decision post processing of blocks of detected bits, the error detection performance of which the present invention recognizes can be improved upon by soft algebraic detection of phase errors in the received data. Accordingly, the present invention solves one or more of the above-stated problems.

SUMMARY OF THE INVENTION

A data encoding device for encoding data to be recorded onto a magnetic recording medium includes a data state machine transforming phase symbols into bits to render a data stream. Also, the device includes a parity state machine inserting at least one parity symbol into the data stream each N-1 symbols in accordance with a second constraint, such that the data stream after parity symbol insertion satisfies a first constraint. In a preferred non-limiting embodiment, the first constraint is a (1, 10) constraint and the second constraint is a (1, 7) constraint.

Preferably, a parity calculator receives an output from the data state machine. The parity calculator determines a parity that satisfies the first constraint, and the parity calculator provides an input to the parity state machine. Desirably, the parameter "N" is adjustable to adjust the encoding rate.

As set forth in detail below, the device undertakes multi-bit symbol correction by first performing symbol by symbol lattice-based maximum-likelihood decoding. This is done by means of calculating the nearest integer node on the lattice from the received digitized symbol phase measurement. This quantization procedure amounts to maximum-likelihood symbol decoding. Since a fixed relation exists between the lattice integer nodes and the multi-bit symbol alphabet, this procedure results in detected magnetic transition symbols. For each detected symbol, the quantization error, i.e. the distance between the received digitized symbol phase and the nearest-neighbor integer lattice node into which the symbol has been mapped, is also stored. This quantization error represents a measure of the reliability, i.e. the soft information, of the detected magnetic transition symbol.

Next, it is determined whether the detected magnetic transition symbol satisfies the catenation rule of the finite state machine constraint, imposed before writing, i.e. whether it can be legally catenated to the last detected symbol. Violation of the catenation rule indicates a symbol error, such that the erroneous symbol can be replaced by another symbol that does not violate the catenation rule and that furthermore is closest to the erroneously detected symbol in the lattice distance metric. The latter procedure always results in a sequence of N symbols that satisfy the catenation rule, at which point the symbol parity check is determined.

In the event of a parity failure, the symbol soft information is used to make a final decision on erasing the symbols most likely in error. The quantization errors are arranged in increasing reliability order, and the least unreliable, below a programmable threshold, is erased. It is to be understood that such an erasure decision algorithm should be adjusted to flexibly fit actual experimental data. The erasure flags are then supplied to an outer code.

In another aspect, a computer program device includes a computer readable medium having a program of instructions thereon for processing data associated with a magnetic recording medium. The program of instructions includes logic means for translating between phase symbols and data bits in accordance with a data recording constraint, and logic means for determining parity symbols in accordance with a parity constraint without violating the data recording constraint.

In still another aspect, a method for error correction in magnetic recording includes receiving digitized phase symbols representing bits from a recording, medium. The method also includes, for each symbol, determining a closest node on a lattice. Using maximum likelihood decoding, the method can be used to correct the most likely symbol errors.

In yet another aspect, a data decoding device includes plural state machines cooperating on received coded data to perform maximum likelihood decoding on the received coded data using soft algebraic error detection.

The details of the present invention, both as to its structure and operation, can best be understood in reference to the accompanying drawings, in which like reference numerals refer to like parts, and in which:

BRIEF DESCRIPTION OF THE DRAWINGS

FIG. 4 is a schematic representation of the data state machine of the encoder;

FIG. 5 is a schematic representation of the parity state machine of the encoder;

FIGS. 7–9 show the quantization algorithm.

DETAILED DESCRIPTION OF THE PREFERRED EMBODIMENTS

Figure 1:
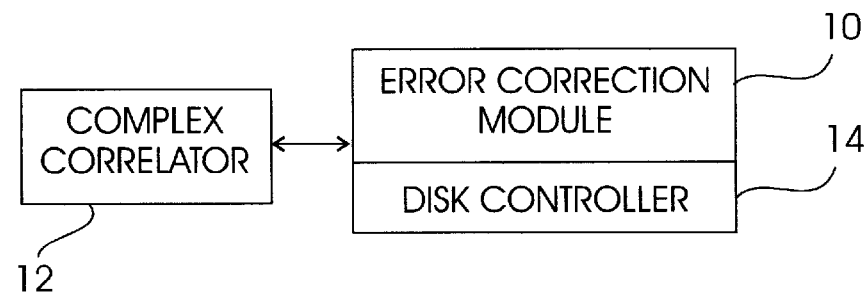
FIG. 1 is a block diagram of the present system.

Referring initially to FIG. 1, an error correction module 10 is shown for correcting noise and interbit errors in digitized signals from an MR/GMR head. In the particular embodiment shown, digitized complex phases of 3-bit symbols are received from a complex correlator 12 of a matched filter/complex correlator circuit as disclosed in co-pending application (ARC9-2000-0053), incorporated herein by reference, it being understood that the principles set forth herein apply equally to other sources of digitized data. As shown in FIG. 1, if desired, the module 10 can be embodied in a disk controller 14. In any case, it will readily be appreciated that the signal from the complex correlator 12 represents data associated with a data storage medium, such as a magnetic disk of a hard disk drive, although other recording media, such as magnetic tape, floppy diskette, and so on can be used.

Figure 2:
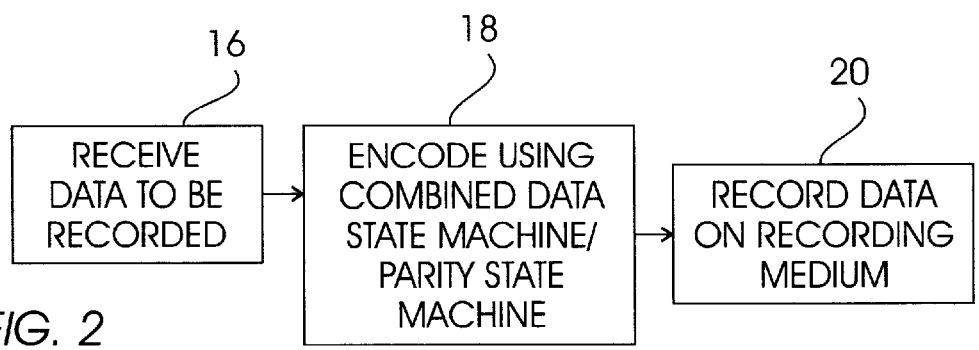
FIG. 2 is a flow chart of the encoding logic.
Figure 3:
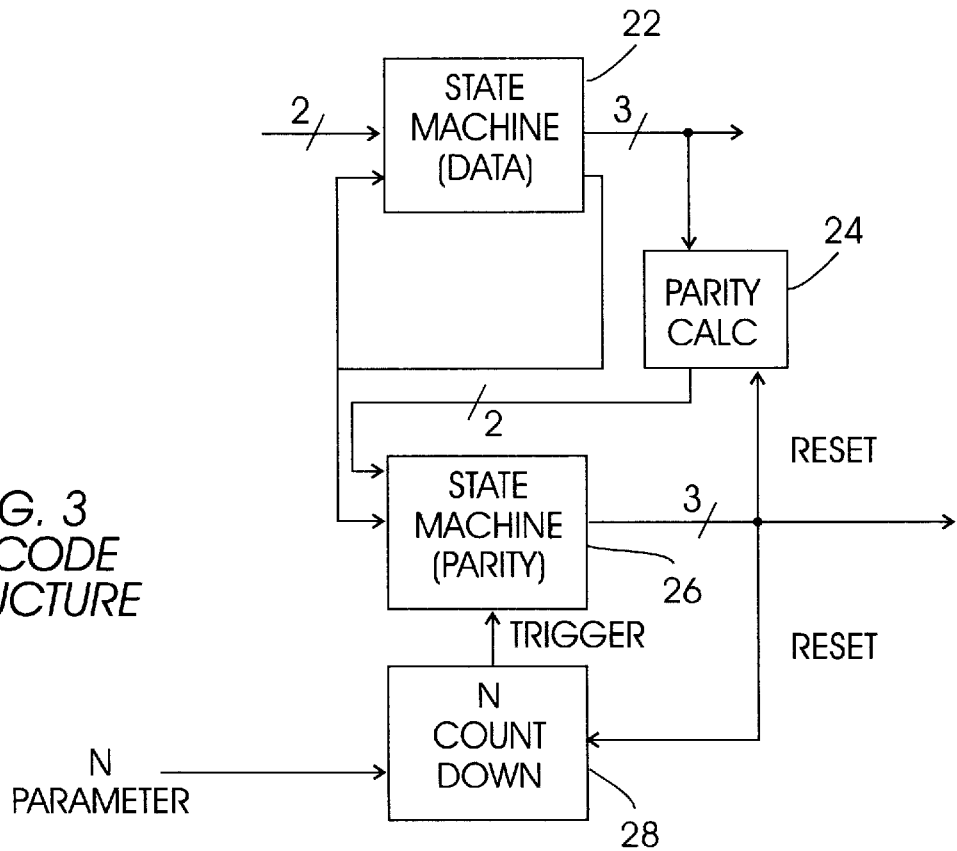
FIG. 3 is a block diagram of a portion of the encoding structure.

FIG. 2 shows the logic, and FIGS. 3–5 show the structures, of the present encoding device. The encoding device is used in reverse for decoding. Commencing at block 16, data to be recorded is received. At block 18, the data is encoded using the combined data state machine and parity state machine described below. It is assumed that the data has been previously encoded with an outer code, such as but not limited to a Reed-Solomon encoder disclosed in U.S. Pat. No. 5,428,628, incorporated herein by reference. It is to be understood that decoding portion of the present invention likewise employs an outer decoder following the inventive inner code decoding disclosed herein. The data is then written to a magnetic recording medium at block 20.

FIG. 3 shows the structure for undertaking the above logic. A data state machine 22 receives 2-bit symbols, and the data state machine 22 maps each symbol to three bits in accordance with a data recording constraint. While all constraints are within the scope of the present invention, in one preferred embodiment the constraint used by the data state machine 22 is the so-called (1, 7) constraint disclosed in U.S. Pat. No. 4,413,251, incorporated herein by reference.

A parity calculator 24 receives the output of the data state machine 22 and determines a parity symbol that satisfies a parity constraint, such as but not limited to the (1, 10) constraint. The parity symbol is a 3-bit symbol that guarantees that for every N symbols, wherein N can be adjusted as desired to establish a desired rate, the cumulative parity will be 0 mod3, where every 3-bit symbol has an attached parity value in the range [0,1,2]. This guarantees the subsequent detection of any single bit shift or missing bit in a block of N 3-bit symbols. Importantly, when the parity symbol is inserted into the bit stream every N−1 symbols as more fully disclosed below, the bit stream following the parity check will satisfy the (1, 10) constraint.

As shown in FIG. 3, the parity calculator 24 sends its output to a parity state machine 26, which also receives input from the data state machine 22. The parity state machine 26 generates the calculated 3-bit parity symbol for insertion into the data stream every N−1 symbols. A countdown clock 28 which receives the desired value of "N" triggers the parity state machine 26 to generate a parity symbol at the appropriate time, which then resets the clock 28 and parity calculator 24. The outputs of the parity state machine 26 and data state machine 22 are combined, i.e., the parity symbols are interleaved with the data symbols, for processing by the outer code and recording onto a recording medium.

FIGS. 4 and 5 respectively show non-limiting schematic representations of presently preferred data and parity state machines 22, 26. Referring first to FIG. 5, the parity state machine 26 correlates a calculated parity [0, 1, 2] and state from the parity calculator 24 to a 3-bit parity symbol ( "0" parity is schematically shown in FIG. 5 by a single "0"). The parity state machine 26 is configured complementarily to the data state machine 22, such that, as set forth above, when the parity symbols are inserted every N—1 data symbols, a single inserted parity check does not violate a parity constraint (e.g., the (1, 7) constraint) and furthermore the data following the parity check satisfies the data constraint (e.g., the (1, 10) constraint).

Figure 5A:
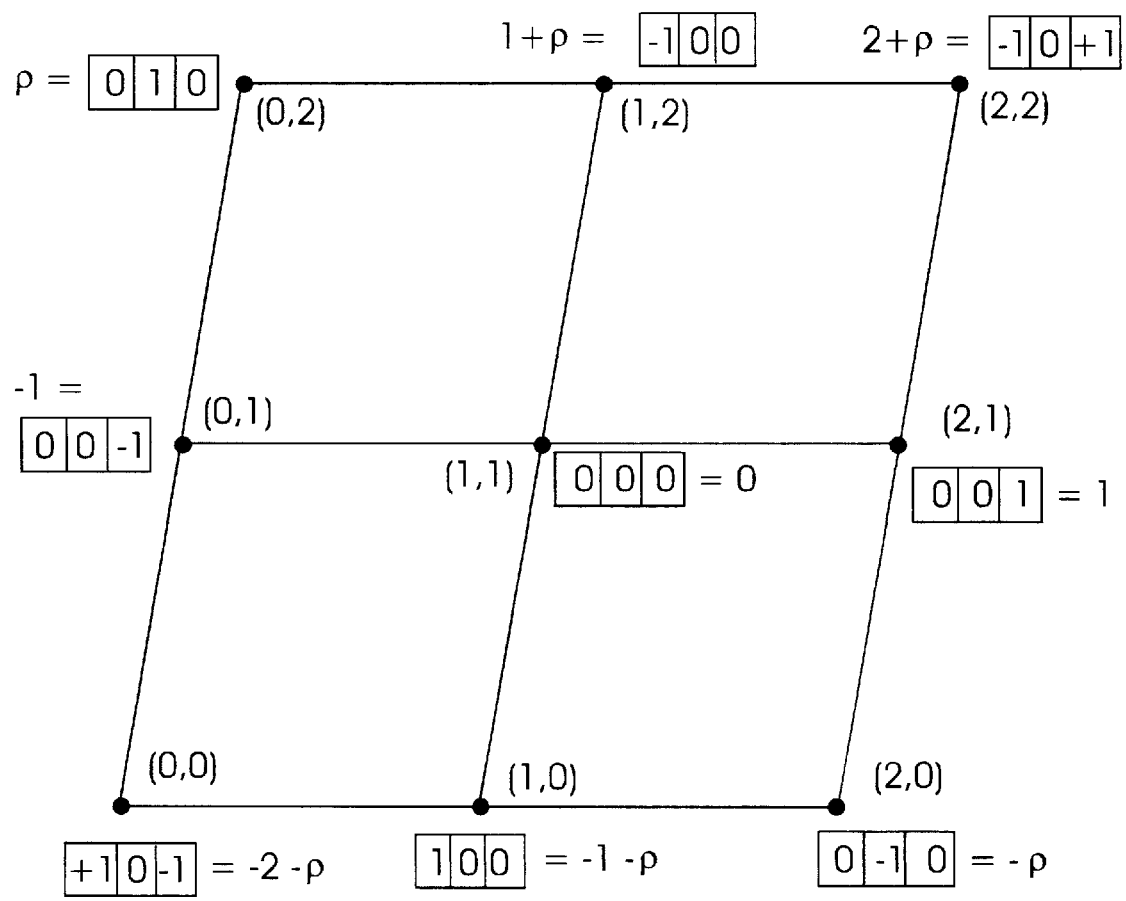
FIG. 5A illustrates the correspondence between multi-bit magnetic transition symbols and integer lattice nodes.

Referring back to FIG. 4, the admissible recorded 3-bit magnetic transitions determined by the state machines shown in FIGS. 4 and 5 have phases whose values lie on the lattice L[1, (1+j√3)/2]. This lattice is shown in FIG. 5A. As disclosed in co-pending U.S. patent application Serial No. [IBM docket no. ARC-2000-0053], incorporated herein by reference, estimates of these phases are calculated by the complex correlator 12 and digitized as discussed further below. In the exemplary embodiment shown the phases are numbers in the field of numbers generated by the third root of unity, whose integers lie on the lattice L. As set forth in greater detail below in reference to FIG. 6, the received digitized 3-bit symbol phases are quantized by taking the dot product of each phase symbol with a lattice matrix "M" represented, in one preferred embodiment, by the following equation:

$$M=[1\ 0\ -1\ 1/\sqrt{3},\ -2/\sqrt{3}\ 1/\sqrt{3}]$$

Further details of the above lattice quantization can be found in Conway et al., "Fast Quantizing and Decoding Algorithms for Lattice Quantizers and Codes", IEEE Transactions on Information Theory, Vol. IT-28, No. Mar. 2, 1982, incorporated herein by reference.

Figure 5B:
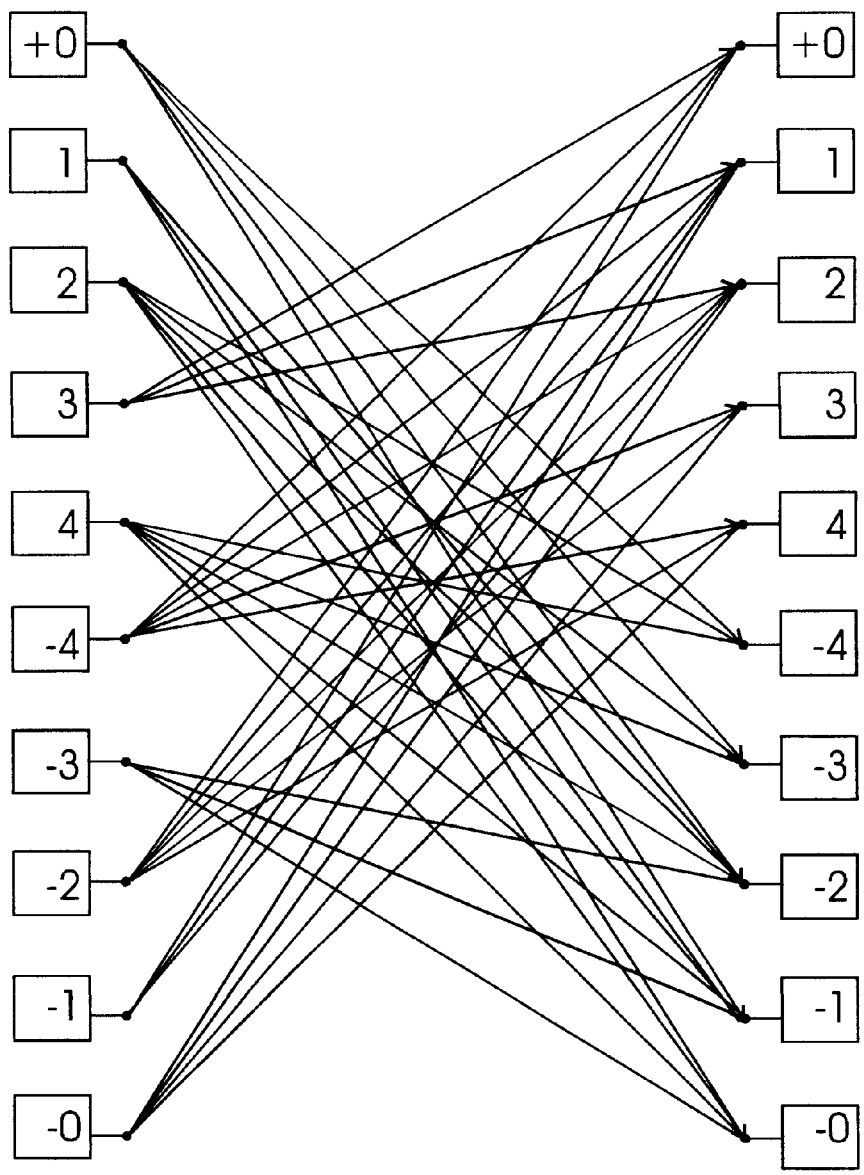
FIG. 5B shows a trellis and its connecting matrix, as determined by the constrained inner code.
Figure 6:
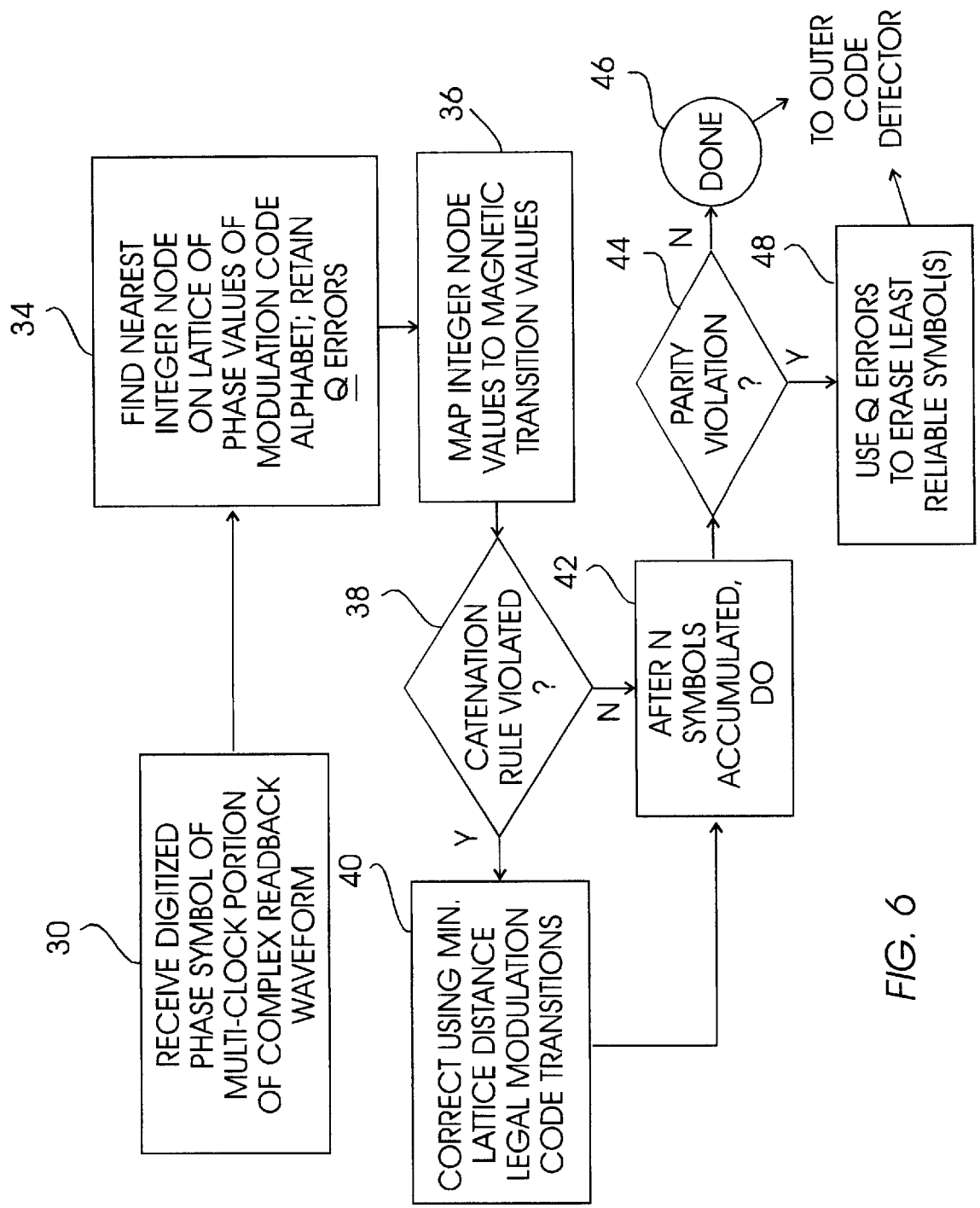
FIG. 6 is a flow chart of the decoding/error correction logic.

Now referring to FIG. 6, the details of the decoding portion of the module 10 can be seen. Essentially, the combined structure shown in FIG. 3 is used as a trellis (illustrated in FIG. 5B) to perform maximum likelihood decoding on a received coded data sequence, thus effectively performing soft algebraic detection on the received data and thereby performing better in terms of error rate detection than hard decision post processing by a parity check matrix.

The trellis shown in FIG. 5B can be extended to depth "N" to close on the parity check.

The complex digitized phase symbols representing a multi-clock portion of a complex magnetic recording medium readback waveform ar received via the complex correlator 12 disclosed in the above-referenced patent application at block 30. Moving to block 34, the complex digitized phase symbols are quantized into lattice nodes using the quantizer matrix M, where the nearest integer node on the lattice of permissible symbol values is found using the principles set forth in Conway et al. These principles, while known in the art of communications, have heretofore not been applied to error detection in magnetic recording data.

As recognized by the present invention, due to noise a digitized phase symbol might not lie exactly on an integer node on the lattice, as it otherwise should. Accordingly, at block 36, for symbols not lying on a node, the nearest node is located and its coordinates used as being representative of the symbol. Moreover, in one preferred embodiment the difference between the symbol and the nearest node, representing a quantization error, is recorded for purposes to be disclosed below. On exemplary quantization error calculation is shown in FIGS. 7–9.

Proceeding to block 36, the symbols are mapped to bits representing magnetic transition values using, in the preferred embodiment, a (1, 7) code alphabet on the lattice [1, (1+jV3)/2]. This renders a data stream having actual parity checks. Moving to decision diamond 38, it is determined whether the detected magnetic transition symbol violates the catenation rule of the finite state machine constraint, imposed before writing, i.e. whether it can be legally catenated to the last detected symbol. Violation of the catenation rule indicates a symbol error. If a catenation violation occurs, the erroneous symbol is replaced at block 40 by another symbol that does not violate the catenation rule and that furthermore is closest to the erroneously detected symbol in the lattice distance metric. The latter procedure always results in a sequence of N symbols that satisfy the catenation rule, at which point the symbol parity check is determined by entering a DO loop at block 42 after a string of "N" symbols has been accumulated.

Specifically, at decision diamond 44 it is determined whether a constraint violation exists by comparing the parity to the appropriate parity check in the data stream. Since the parity check essentially integrates both the data recording constraint and the parity constraint as set forth above, the present parity check also determines whether a data recording constraint violation exists. Essentially, a sequence of symbols establishes a trajectory on the lattice, and it is determined whether the trajectory is permissible by, e.g., looking up the trajectory in a code book of permissible trajectories. The set of permissible trajectories defines an error correction code. For instance, as discussed above each permissible trajectory might be required to satisfy the (1,7) constraint and (1,10) constraint, and so on.

If no constraint was violated, the logic ends at state 46; otherwise, the error can be corrected, if desired, at block 48 by correcting the largest retained error from the lattice quantization operation, if the error is within a predetermined correction distance. Specifically, the last reliable symbol(s) as indicated by the Q errors are erased. From states 46 or 48, the logic accesses an outer code detector such as a Reed-Solomon Code for final block error detection.

While the particular SYSTEM AND METHOD FOR ERROR CORRECTION OF DIGITIZED, PHASE SIGNALS FROM MR/GMR HEAD READBACK WAVEFORMS as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural and functional equivalents to the elements of the above-described preferred embodiment that are known or later come to be known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. § 112, sixth paragraph, unless the element is expressly recited using the phrase "means for" or, in the case of a method claim, the element is recited as a "step" instead of an "act".

We claim:

1. A data encoding device for encoding data to be recorded onto a magnetic recording medium, comprising:
    a data state machine transforming data symbols into phase modulated multibit symbols to render a data stream; and
    a parity state machine inserting at least one parity symbol into the data stream each N−1 phase modulated multibit symbols in accordance with a parity constraint, the data stream after parity symbol insertion satisfying a run length limited constraint, wherein N is an integer.

2. The device of claim 1, wherein the run length limited constraint is a (1, 10) constraint and the parity constraint is a (1, 7) constraint.

3. The device of claim 1, further comprising a parity calculator receiving an output from the data state machine and determining a parity satisfying the run length limited constraint, the parity calculator providing an input to the parity state machine.

4. The device of claim 1, wherein "N" is adjustable.

5. The device of claim 1, wherein the device further includes a disk controller receiving the data stream and recording the stream onto the magnetic recording medium.

6. The device of claim 1, wherein the device receives digitized phase symbols from a magnetic recording medium for decoding thereof, the device undertaking parity checking by performing integer lattice-based maximum likelihood decoding.

7. The device of claim 6, wherein the device is configured to find a nearest node on an integral lattice to at least one received digitized phase symbol, a difference between the received digitized phase symbol and the nearest integer node establishing an error.

8. A method for error correction in magnetic recording, comprising:
    encoding data symbols into phase modulated multibit symbols in accordance with a run length limited constraint:
    determining parity symbols for insertion thereof among the multibit symbols in accordance with a parity constraint such that the run length limited constraint is not violated after insertion of the parity symbols, inserting the parity symbols among the phase modulated multibit symbols;

receiving digitized symbols representing bits from a recording medium;

for each of at least some symbols, determining a closest integer node on a lattice; and using maximum likelihood decoding, determining that an error has occurred.

9. The method of claim 8, further comprising:

converting the bits to symbols in accordance with a data recording constraint.

10. The method of claim 9, further comprising:

reading parity symbols from data received from the recording medium;

calculating parity check symbols in accordance with a parity constraint; and comparing the parity check symbols to the parity symbols to determine the occurrence of errors.

11. The method of claim 8, wherein the run length limited constraint is a (1, 10) constraint and the parity constraint is a (1, 7) constraint.

* * * * *